(12) United States Patent
Yokogawa et al.

(10) Patent No.: US 11,804,573 B2
(45) Date of Patent: Oct. 31, 2023

(54) GROUP III-V LIGHT EMITTING DIODE

(71) Applicant: SEOUL VIOSYS CO., LTD., Gyeonggi-do (KR)

(72) Inventors: Toshiya Yokogawa, Gyeonggi-do (KR); Chae Hon Kim, Gyeonggi-do (KR); Chung Hoon Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 390 days.

(21) Appl. No.: 17/119,139

(22) Filed: Dec. 11, 2020

(65) Prior Publication Data

US 2021/0119082 A1 Apr. 22, 2021

Related U.S. Application Data

(63) Continuation of application No. PCT/KR2019/006833, filed on Jun. 5, 2019.

(30) Foreign Application Priority Data

Jun. 11, 2018 (KR) .................. 10-2018-0067048
Jun. 5, 2019 (KR) .................. 10-2019-0066538

(51) Int. Cl.
*H01L 33/32* (2010.01)
*H01L 33/40* (2010.01)
*H01L 33/60* (2010.01)
*H01L 33/38* (2010.01)

(52) U.S. Cl.
CPC ........... *H01L 33/32* (2013.01); *H01L 33/382* (2013.01); *H01L 33/405* (2013.01); *H01L 33/60* (2013.01)

(58) Field of Classification Search
CPC ..... H01L 33/382; H01L 33/405; H01L 33/10; H01L 33/46; H01L 33/60
See application file for complete search history.

(56) References Cited

U.S. PATENT DOCUMENTS 6,778,572 B1 * 8/2004 Ohsaka ................ H01L 24/05
372/87
7,687,291 B2 * 3/2010 Charache ............. B82Y 20/00
438/33
11,211,525 B2 * 12/2021 Rajan .................. H01L 33/06
(Continued)

FOREIGN PATENT DOCUMENTS

JP 2010-171142 8/2010
KR 10-0714638 5/2007

OTHER PUBLICATIONS

International Search Report for International Application PCT/KR2019/006833, dated Sep. 18, 2019.

*Primary Examiner* — Savitri Mulpuri
(74) *Attorney, Agent, or Firm* — LaBatt, LLC

(57) ABSTRACT

A group III-V light-emitting diode is provided. The light-emitting diode includes a light generating portion including an active layer interposed between a first conductivity type semiconductor layer and a second conductivity type semiconductor layer. The active layer generates light. The light-emitting diode further includes an optical trap disposed on an optical path of light generated from the active layer. The optical trap includes a light absorption layer interposed between light guide layers. The light-emitting diode further includes a side reflector disposed on a side surface of the optical trap.

20 Claims, 11 Drawing Sheets

(56) References Cited

U.S. PATENT DOCUMENTS

| | | |
|---|---|---|
| 2004/0089869 A1 | 5/2004 | Uemura |
| 2004/0245535 A1 | 12/2004 | D'Evelyn et al. |
| 2005/0047743 A1* | 3/2005 | Nakaji ................. H01L 31/105 257/E31.061 |
| 2017/0005235 A1 | 1/2017 | Chou |

* cited by examiner

Coefficient of absorption(cm⁻¹)

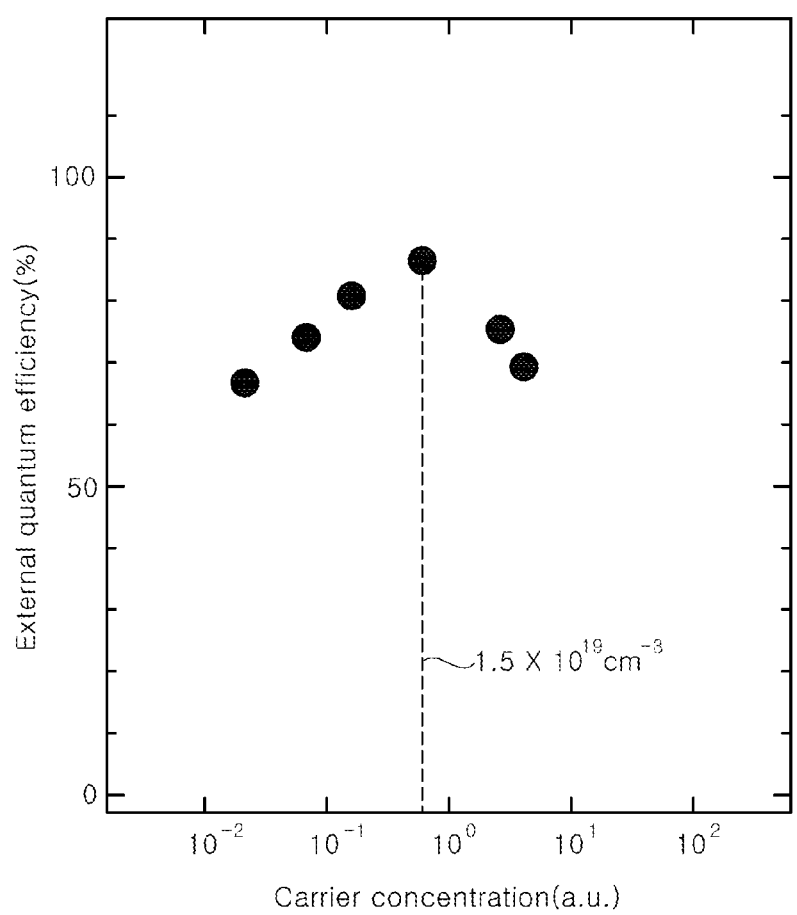

GROUP III-V LIGHT EMITTING DIODE

CROSS-REFERENCE TO RELATED APPLICATIONS AND PRIORITY

The present application is a continuation of International Application No. PCT/KR2019/006833, filed on Jun. 5, 2019, which claims priority to and the benefit of Korean Patent Application No. 10-2018-0067048, filed on Jun. 11, 2018, the disclosures of which are incorporated herein in their entirety.

TECHNICAL FIELD

Embodiments of the present disclosure relate to a group III-V light emitting diode and, more particularly, to a light emitting diode having improved external quantum efficiency.

BACKGROUND

The statements in this section merely provide background information related to the present disclosure and may not constitute prior art.

A light emitting diode (LED) using semiconductors, such as GaAs and InGaP-based semiconductors, employs a GaAs substrate as a substrate for epitaxial growth. Such a group III-V-based LED is formed through homo-epitaxial growth for lattice matching with a semiconductor substrate. On the other hand, for a GaN-based LED, a sapphire substrate that is a heterogeneous substrate has been adopted as a growth substrate. However, due to difficulty in formation of such heterogeneous substrate lattice matching, homo-epitaxial growth using a bulk GaN substrate is generally employed.

Upon operation of an LED at high current density, heat is generated due to increase in current density near a boundary between an n-electrode and a p-electrode. In a GaN-based LED using an insulating substrate, such as a sapphire substrate and the like, significant current crowding occurs between the n-electrode and the p-electrode due to a small thickness of an n-type GaN layer in which electric current flows. As a result, a large quantity of heat is generated from the light emitting diode, thereby increasing bonding temperature while causing deterioration in internal quantum efficiency.

On the other hand, an LED using a GaN substrate cannot improve reliability of devices due to crystal defects, particularly, low dislocation density. In particular, the LED using the GaN substrate can suppress current crowding by distributing electric current through a relatively large thickness. As the thickness of the GaN substrate increases, electric current injected through the p-electrode side is deeply and broadly distributed in a relatively thick n-type GaN region to relieve current crowding between the n-electrode and the p-electrode, thereby reducing forward voltage while relieving a droop phenomenon (Prior Literature 1: Yokogawa et. Al., Japanese Journal of Applied Physics 53, 102101 (2014)).

SUMMARY

Luminous efficiency of an LED is generally represented by external quantum efficiency. External quantum efficiency of the LED is a product of internal quantum efficiency and light extraction efficiency of an active layer. On the other hand, main causes of deterioration in light extraction efficiency include (1) band edge absorption of semiconductor layers other than the active layer, (2) free carrier absorption by electrons or holes in a semiconductor substrate, and (3) total internal reflection on a chip surface.

In a GaN-based LED, since the band gap of the active layer is generally smaller than the band gap of other semiconductor layers, the LED undergoes insignificant influence of band edge absorption. In addition, for an LED adopting a sapphire substrate, since an n-type GaN layer has a small thickness, the LED undergoes insignificant influence of free carrier absorption.

In the meantime, a bulk GaN substrate can decrease resistance of the n-type GaN layer by increasing the concentration of dopants, such as Si, thereby reducing forward voltage of the LED while relieving the drooping phenomenon. However, increase in carrier concentration causes increase in free carrier absorption.

Further, photons emitted from the active layer are propagated to the n-type GaN (substrate) and enter an interface between the n-type GaN and air. However, photons incident on the interface between the n-type GaN and air at a certain angle (critical angle) or more cannot be discharged outside and return back to the interior of the light emitting diode due to total internal reflection. Furthermore, since GaN has a greater index of refraction than a sapphire substrate, GaN has a smaller critical angle and can cause increase in quantity of light returning back due to total internal reflection. The light subjected to total internal reflection is repeatedly propagated in a semiconductor crystal and is partially lost as heat through absorption into the n-type GaN. Here, when the carrier concentration is increased to reduce resistance of the n-type GaN, absorption of photons by the n-type GaN increases due to Si dopants or complex defect levels, thereby causing deterioration in external quantum efficiency. Further, for the GaN substrate, since the n-type GaN has a large thickness of about 100 μm, photons subjected to total reflection are likely to be absorbed and lost in the course of traveling over a long distance in the light emitting diode.

When a relatively thick semiconductor substrate is used while increasing the carrier concentration in order to reduce resistance of the substrate, there is a problem of trade-off between increase in voltage efficiency and deterioration in external quantum efficiency through increase in free carrier absorption. Such a problem occurs not only in the GaN-based light emitting diode but also in GaAs or InGaP-based light emitting diodes.

In some embodiments, the present disclosure is directed to providing a light emitting diode capable of securing high output and high efficiency by suppressing current crowding upon operation at high drive current so as to realize reduction in forward voltage and relief of the droop phenomenon while suppressing light loss by free carrier absorption.

In accordance with an embodiment of the present disclosure, a light emitting diode may include: a light generation portion including an active layer interposed between a first conductivity type semiconductor layer and a second conductivity type semiconductor layer, the active layer generating light; an optical trap disposed on an optical path of light generated from the active layer and including a light absorption layer interposed between light guide layers; and a side reflector disposed on a side surface of the light trap.

In accordance with another embodiment of the present disclosure, a light emitting diode includes: a first conductivity type semiconductor layer; an active layer disposed on the first conductivity type semiconductor layer; a second conductivity type semiconductor layer disposed on the active layer; a reflective electrode disposed on the second conductivity type semiconductor layer; a first light guide layer disposed under the first conductivity type semiconductor layer; a light absorption layer disposed under the first light guide layer; a second light guide layer disposed under the light absorption layer; and a side reflector disposed on a side surface of the light absorption layer, where the light absorption layer includes a semiconductor layer having an energy band gap narrower than or equal to an energy band gap of the active layer.

In accordance with yet another embodiment of the present disclosure, a light emitting diode includes: a light generation portion including an active layer interposed between a first conductivity type semiconductor layer and a second conductivity type semiconductor layer and generating light; and an optical trap disposed on an optical path of light generated from the active layer and including a first light absorption layer interposed between light guide layers, wherein the first light absorption layer includes a constant composition layer and a gradient composition layer, the gradient composition layer being interposed between the constant composition layer and the active layer.

In accordance with another embodiment of the present disclosure, a light emitting device includes: a mount substrate; and a light emitting diode mounted on the mount substrate, where the light emitting diode may include the light emitting diodes set forth above.

In use of a semiconductor substrate, such as a GaN substrate, light loss occurs through absorption of light by total internal reflection, thereby providing light extraction efficiency of about 70%. On the contrary, according to embodiments of the present disclosure, a light emitting diode adopts an optical trap to prevent light loss through absorption of light, thereby improving light extraction efficiency. Further, the light emitting diode according to the embodiments can further reduce resistance of the substrate by allowing increase in concentration of dopants, such as Si, while preventing light loss, thereby realizing reduction in forward voltage and relief of a drooping phenomenon of the light emitting diode. Furthermore, the light emitting diode according to the embodiments can further relieve the droop phenomenon through optical amplification using simulated emission to realize high external quantum efficiency at high current density, thereby realizing high output through one light emitting diode.

This section provides a general summary of the disclosure and is not a comprehensive disclosure of its full scope or all of its features. The above and other advantages and effects of the present disclosure will become apparent from the following detailed description of the present disclosure. Further areas of applicability will become apparent from the description provided herein. It should be understood that the description and specific examples are intended for purposes of illustration only and are not intended to limit the scope of the present disclosure.

DESCRIPTION OF DRAWINGS

In order that the disclosure may be well understood, there will now be described various forms thereof, given by way of example, reference being made to the accompanying drawings, in which:

FIG. 8B is a graph depicting external quantum efficiency depending upon carrier concentration according to one embodiment of the present disclosure;

DETAILED DESCRIPTION

Figure 1:
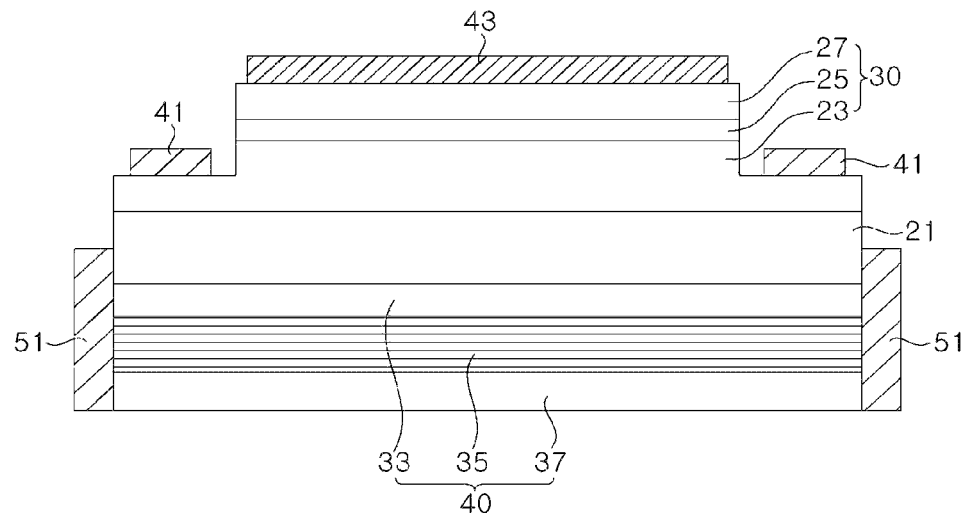
FIG. 1 is a schematic sectional view of a light emitting diode according to one embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or component is referred to as being "disposed above" or "disposed on" another element or component, it can be directly "disposed above" or "disposed on" the other element or component or intervening elements or components can be present. Throughout the specification, like reference numerals denote like elements having the same or similar functions.

In accordance with one embodiment of the present disclosure, a light emitting diode includes: a light generation portion including an active layer interposed between a first conductivity type semiconductor layer and a second conductivity type semiconductor layer, the active layer generating light; an optical trap disposed on an optical path of light generated from the active layer and including a light absorption layer interposed between light guide layers; and a side reflector disposed on a side surface of the light trap.

In one embodiment, the light absorption layer may have a multi-quantum well structure including multiple barrier layers and multiple well layers.

The well layers of the light absorption layer may have an energy band gap narrower than or equal to energy of the light generated from the active layer. Accordingly, the light absorption layer can generate free carriers by absorbing the light generated from the active layer.

The active layer may have a multi-quantum well structure including multiple barrier layers and multiple well layers. The well layers of the light absorption layer have an energy band gap narrower than or equal to an energy band gap of the well layers of the active layer.

The light emitting diode may further include a reflective electrode disposed on the second conductivity type semiconductor layer and electrically connected to the second conductivity type semiconductor layer, where the optical trap may be disposed under the first conductivity type semiconductor layer to face the reflective electrode with the light generation portion disposed therebetween.

The light emitting diode may further include a semiconductor substrate interposed between the light generation portion and the optical trap. The semiconductor substrate may be a GaN-based substrate, without being limited thereto.

The semiconductor substrate may have a thickness of 10 µm to 100 µm.

The light guide layers may be of the same conductivity type as the first conductivity type semiconductor layer.

The light emitting diode may further include an electrode electrically connected to the first conductivity type semiconductor layer.

In some embodiments, the light emitting diode may further include an additional electrode electrically connected to the optical trap.

Further, a light guide layer adjacent to the additional electrode may be of a second conductivity type.

In accordance with another embodiment of the present disclosure, a light emitting diode includes: a first conductivity type semiconductor layer; an active layer disposed on the first conductivity type semiconductor layer; a second conductivity type semiconductor layer disposed on the active layer; a reflective electrode disposed on the second conductivity type semiconductor layer; a first light guide layer disposed under the first conductivity type semiconductor layer; a light absorption layer disposed under the first light guide layer; a second light guide layer disposed under the light absorption layer; and a side reflector disposed on a side surface of the light absorption layer, where the light absorption layer includes a semiconductor layer having an energy band gap narrower than or equal to energy of the light generated from the active layer.

The light emitting diode may further include a semiconductor substrate interposed between the first conductivity type semiconductor layer and the first light guide layer, wherein the semiconductor substrate may be of the same conductivity type as the first conductivity type semiconductor layer.

The side reflector may cover at least part of the semiconductor substrate.

The light emitting diode may emit light through the second light guide layer.

In some embodiments, the light emitting diode may further include: a first electrode electrically connected to the first conductivity type semiconductor layer; and an additional electrode electrically connected to the second light guide layer.

In accordance with a further embodiment of the present disclosure, a light emitting diode includes: a light generation portion including an active layer interposed between a first conductivity type semiconductor layer and a second conductivity type semiconductor layer, the active layer generating light; and an optical trap disposed on an optical path of light generated from the active layer and including a first light absorption layer interposed between light guide layers, wherein the first light absorption layer includes a constant composition layer and a gradient composition layer interposed between the constant composition layer and the active layer.

The first light absorption layer may be separated a distance of 400 nm or less, specifically 300 nm or less, from the active layer.

The constant composition layer may have a thickness of 10 nm or more and the first light absorption layer may have a total thickness of 30 nm to 90 nm.

The first light absorption layer may be formed of a GaN-based semiconductor having the same composition as well layers of the active layer.

The light emitting diode may further include: a second light absorption layer disposed on the second conductivity type semiconductor layer, wherein the second light absorption layer may be separated a distance of 100 nm or less. Specifically, the second light absorption layer may be separated a distance of 80 nm or less, more specifically 50 nm or less, from the active layer.

The second light absorption layer may be formed of a GaN-based semiconductor having the same composition as well layers of the active layer.

The light emitting diode may further include a dielectric layer covering a side surface of the optical trap. For example, the dielectric layer may be formed of $SiO_2$, $Si_3N_4$, or $TiO_2$.

In accordance with yet another embodiment of the present disclosure, a light emitting device includes: a mount substrate; and a light emitting diode mounted on the mount substrate, wherein the light emitting diode may include the light emitting diode set forth above.

Further, the light emitting diode may be flip-bonded to the mount substrate.

The light emitting device may further include a heat sink disposed under the mount substrate.

Hereinafter, embodiments of the present disclosure will be described in detail with reference to the drawings.

Figure 2:
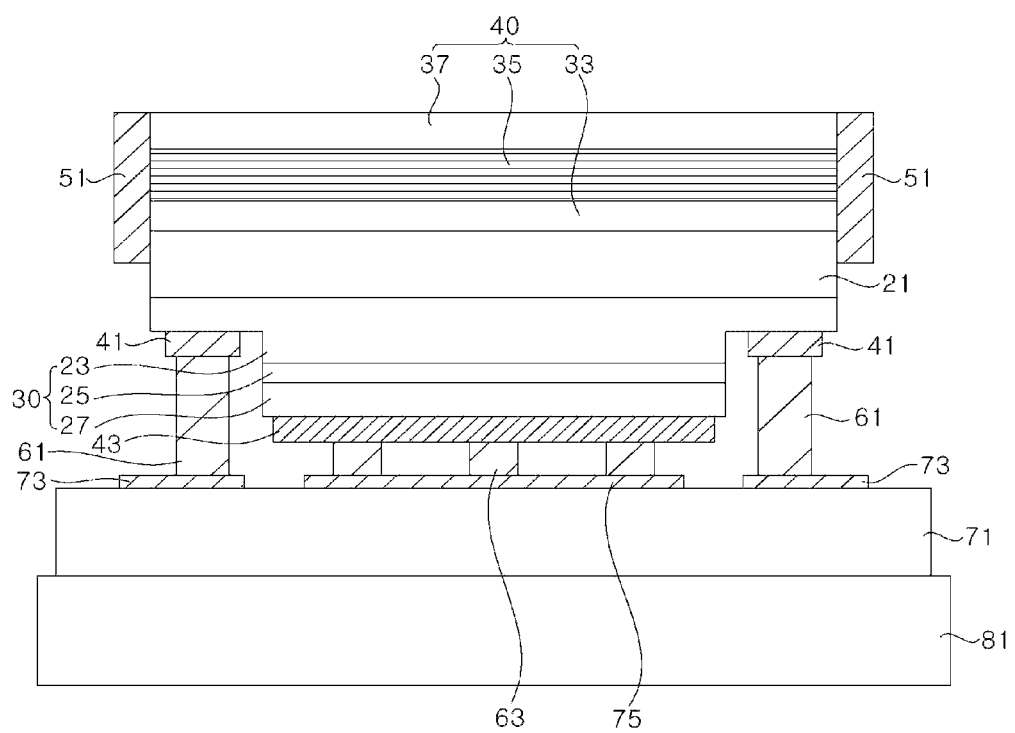
FIG. 2 is a schematic sectional view of a light emitting device with the light emitting diode of FIG. 1 mounted thereon.

FIG. 1 is a schematic sectional view of a light emitting diode according to one embodiment of the present disclosure and FIG. 2 is a schematic sectional view of a light emitting device with the light emitting diode of FIG. 1 mounted thereon.

Referring to FIG. 1, the light emitting diode according may include a substrate 21, a light generation portion 30, an optical trap 40, a first electrode 41, a reflective electrode 43, and a side reflector 51. The light generation portion 30 may include a first conductivity type semiconductor layer 23, an active layer 25, and a second conductivity type semiconductor layer 27. The optical trap 40 may include first and second light guide layers 33, 37 and a light absorption layer 35.

The substrate 21 is a growth substrate for growth of semiconductor layers and may be a semiconductor substrate. The substrate 21 has conductivity and may be doped with n-type dopants. For example, the substrate 21 may be a GaN substrate for growth of a GaN-based semiconductor layer.

The light generation portion 30 may be disposed on the substrate 21. The light generation portion 30 includes the active layer 25 interposed between the first conductivity type semiconductor layer 23 and the second conductivity type semiconductor layer 27 and generates light through recombination of electrons and holes in the active layer 25.

The first conductivity type semiconductor layer 23 may be grown on the substrate 21 and may be a GaN-based semiconductor layer. The first conductivity type semiconductor layer 23 may be an n-type GaN-based semiconductor layer doped with dopants, for example, Si. Although the first conductivity type semiconductor layer 23 is illustrated as being distinguished from the substrate 21 in this embodiment, a boundary therebetween may be unclear. That is, the first conductivity type semiconductor layer 23 may be formed of the same material as the substrate 21. Alternatively, the substrate 21 may be used as the first conductivity type semiconductor layer 23.

The active layer 25 and the second conductivity type semiconductor layer 27 are disposed on the first conductivity type semiconductor layer 23. The active layer 25 and the second conductivity type semiconductor layer 27 may be disposed in the shape of a mesa in some region on the first conductivity type semiconductor layer 23. Accordingly, regions near an edge of the first conductivity type semiconductor layer 23 may be exposed instead of being covered by the active layer 25 and the second conductivity type semiconductor layer 27. Here, as shown in FIG. 1, the mesa may include some thickness portions of the first conductivity type semiconductor layer 23.

The active layer 25 is interposed between the first conductivity type semiconductor layer 23 and the second conductivity type semiconductor layer 27. The active layer 25 may have a single quantum well structure or a multi-quantum well structure. In particular, the active layer 25 may have a multi-quantum well structure in which multiple barrier layers and multiple well layers are alternately stacked one above another. In the active layer 25, the composition and thickness of the well layers determine the wavelength of light generated therefrom. In particular, it is possible to provide a light emitting diode generating UV light, blue light or green light through regulation of the composition of the well layers.

The second conductivity type semiconductor layer 27 may be a p-type GaN-based semiconductor layer doped with p-type dopants, for example, Mg. Each of the first conductivity type semiconductor layer 23 and the second conductivity type semiconductor layer 27 may be a single layer or multiple layers, or may include a super-lattice layer. The first conductivity type semiconductor layer 23, the active layer 25, and the second conductivity type semiconductor layer 27 may be formed on the substrate 21 in a chamber by well-known techniques, such as metal organic chemical vapor deposition (MOCVD) or molecular bean epitaxy (MBE).

On the other hand, the first electrode 41 forms ohmic contact with the first conductivity type semiconductor layer 23. As shown in the drawings, the first electrode 41 may be disposed near the mesa. However, it should be understood that the present disclosure is not limited thereto. Alternatively, a via-hole may be formed through the mesa and the first electrode 41 may form ohmic contact with the first conductivity type semiconductor layer 23 in the via-hole.

The reflective electrode 43 forms ohmic contact with the second conductivity type semiconductor layer 27. The reflective electrode 43 may be disposed substantially over the entirety of the second conductivity type semiconductor layer 27 in an upper region of the mesa. For example, the reflective electrode 43 may cover 80% or more, specifically 90% or more, of an upper region of the second conductivity type semiconductor layer 27.

The reflective electrode 43 may include a reflective metal layer to reflect light, which was generated from the active layer 25 and reaches the reflective electrode 43, towards the substrate 21. For example, the reflective electrode 43 may be formed of a single reflective metal layer, without being limited thereto. Alternatively, the reflective electrode 43 may include an ohmic layer and a reflective layer. The ohmic layer may be a metal layer, such as Ni, or a conductive oxide layer, such as ITO. The reflective layer may be a metal layer having high reflectance, such as Ag or Al. The reflective electrode 43 may include a barrier layer and may include, for example, Ni, Ti, or Au.

When electric power is supplied from an external power source to the light emitting diode through the first electrode 41 and the reflective electrode 43, recombination of electrons and holes occurs in the active layer 25 to generate light.

In some embodiments, the optical trap 40 is disposed under the substrate 21. The optical trap 40 may be disposed on an optical path of light generated from the light generation portion 30 to absorb the light.

The optical trap 40 includes the light absorption layer 35 interposed between the light guide layers 33, 37. The light guide layers 33, 37 are formed of semiconductor layers each having a lower index of refraction than the light absorption layer 35. For example, the light guide layers 33, 37 may be formed of a low refractivity layer, such as AlGaN or AlGaAs. The light absorption layer 35 is formed of a semiconductor having an energy band gap narrower than or equal to an energy band gap of the active layer 25. For example, the light absorption layer 35 may include multiple barrier layers and multiple well layers, in which the well layers of the light absorption layer 35 may have an energy band gap narrower than or equal to an energy band gap of the well layers of the active layer 25. Light incident on the optical trap 40 is trapped in the light absorption layer 35 by the light guide layers 33, 37 and is absorbed into the light absorption layer 35 to generate carriers.

On the other hand, total internal reflection of light occurs at the interface between the light guide layer 37 and air. The light subjected to total internal reflection on the surface of the light guide layer 37 returns back to the light absorption layer 35 and may be trapped by the light guide layers 33, 37.

The light guide layers 33, 37 may have the same conductivity type as the first conductivity type semiconductor layer 23. As a result, the substrate 21 and the optical trap 40 can reduce resistance in the light emitting diode, thereby reducing forward voltage of the light emitting diode.

The side reflector 51 is disposed on a side surface of the optical trap 40. The side reflector 51 may be disposed along the side surface of the optical trap 40. The side reflector 51 may be restrictively formed on the side surface of the optical trap 40, without being limited thereto. Alternatively, as shown in FIG. 1, the side reflector 51 may cover at least part of the substrate 21. The side reflector 51 may include, for example, a reflective metal layer, such as Ag or Al, and may further include a bonding layer, such as Ni or Ti, to improve bonding strength. Further, a barrier layer, such as Ni or Ti, may be disposed on the reflective metal layer and an anti-oxidation layer, such as Au, may be disposed on the barrier layer. The side reflector 51 may be an omni-directional reflector (ODR) including a transparent oxide layer between the reflective metal layer and the optical trap 40.

The side reflector 51 prevents light, which travels in the light absorption layer 35 along the light guide layers 33, 37, from being discharged outside by reflecting the light. As a result, light trapped in the light absorption layer 35 reciprocates between the side reflectors 51 and is absorbed into the light absorption layer 35 to generate free carriers.

Although the GaN-based light emitting diode is illustrated in this embodiment, GaAs or InGaP-based light emitting diodes may also be used in other embodiments. For example, GaAs or InGaP-based semiconductor layers 23, 25, 27 may be formed on a GaAs substrate 21, and AlGaAs light guide layers 33, 37 and InGaAs light absorption layer 35 may be formed under the GaAs the substrate 21.

Referring to FIG. 2, a light emitting device may include a mount substrate 71 together with the light emitting diode described above and may further include a heat sink 81.

The mount substrate 71 may be, for example, a ceramic substrate, such as an AlN substrate, and may include pads 73, 75 on a surface thereof.

The heat sink 81 may be disposed under the mount substrate 71 to discharge heat from the light emitting diode. The heat sink 81 may be formed of, for example, a metallic material having high thermal conductivity, such as Cu.

The light emitting diode may be mounted on the mount substrate 71 through bumps 61, 63. The bump 61 electrically connects the first electrode 41 to the pad 73 and the bump 63 electrically connects the reflective electrode 43 to the pad 75.

It should be understood that FIG. 2 shows one example of the light emitting device and embodiments of the present disclosure may provide various light emitting devices using flip bonding.

On the other hand, light generated from the active layer 25 may pass through the optical trap 40 and be finally discharged from the light emitting diode.

In a typical light emitting diode not adopting the optical trap 40, light generated from the active layer 25 may be discharged from the light emitting diode through the substrate 21. Here, light incident on the interface between the substrate 21 and air at a greater incidence angle than the critical angle is subjected to internal total reflection at the interface therebetween and is lost through absorption by crystal defects or free carriers in the substrate 21 having a relatively large thickness.

In some embodiments, the light emitting diode adopts the optical trap 40, thereby enabling use of light generated from the active layer 25 to generate free carriers in the light absorption layer 35, in which the carriers are moved to the active layer 25 and are reused to generate light.

Further, when light is trapped at high density by the optical trap 40 to generate a high concentration of carriers, optical gain occurs in the optical trap 40, thereby enabling amplification of light passing through the optical trap 40. With regard to this, influence of the coefficient of absorption and optical gain of the GaN semiconductor on light extraction efficiency will be described with reference to FIG. 3 to FIG. 5.

Figure 3:
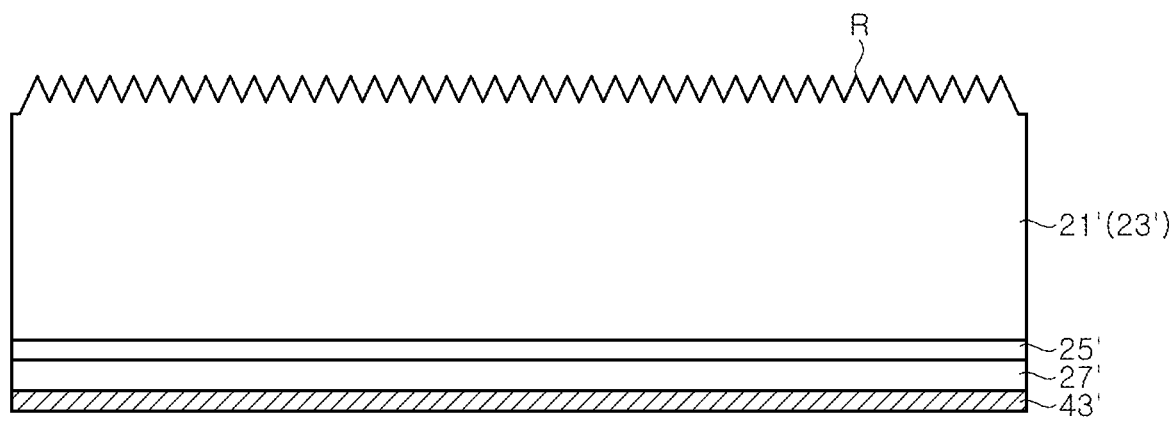
FIG. 3 is a sectional view of a light emitting diode simplified for calculation of light extraction efficiency.

First, light extraction efficiency was calculated based on beam tracking simulation. The light extraction efficiency is defined as a ratio of the intensity of light emitted from the light emitting diode to air to the intensity of light generated from the active layer. FIG. 3 is a sectional view of a light emitting diode simplified for calculation of light extraction efficiency. Here, the structure of the light emitting diode is simplified for clarity of effects, as compared with an actual light emitting diode, and includes a substrate 21', a GaN-based active layer 25', a p-type semiconductor layer 27', and a reflective electrode 43' together with a texture structure R for improvement in light extraction efficiency. The substrate 21' was integrated with an n-type semiconductor layer 23'. The overall thickness of the GaN-based semiconductor layers 21', 25', 27' was set to 100 μm. Calculation was performed for two cases of the reflective electrode 43 having a reflectance of 95% and a reflectance of 75%, respectively. Anti-reflective (AR) coating was not performed.

Figure 4:
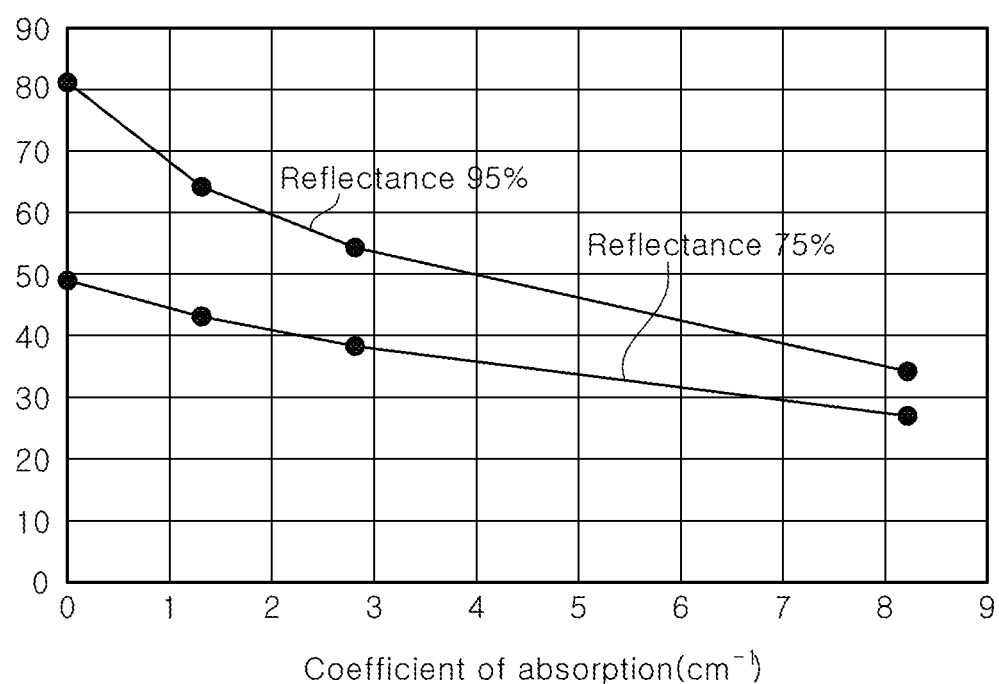
FIG. 4 is a graph depicting light extraction efficiency depending upon coefficient of absorption.

First, dependency of light extraction efficiency was investigated by changing the coefficient of absorption of the GaN-based semiconductor and is shown in FIG. 4. Referring to FIG. 4, it can be seen that light extraction efficiency decreases with increasing coefficient of absorption of the GaN-based semiconductor. For the reflective electrode 43 having a reflectance of 95%, the light extraction efficiency rapidly deteriorates with increasing coefficient of absorption. When the coefficient of absorption was about 8 $cm^{-1}$, the light emitting diode had a small light extraction efficiency of about 30%, which was not significantly different from the light extraction efficiency of the reflective electrode 43 having a reflectance of 75%.

Figure 5:
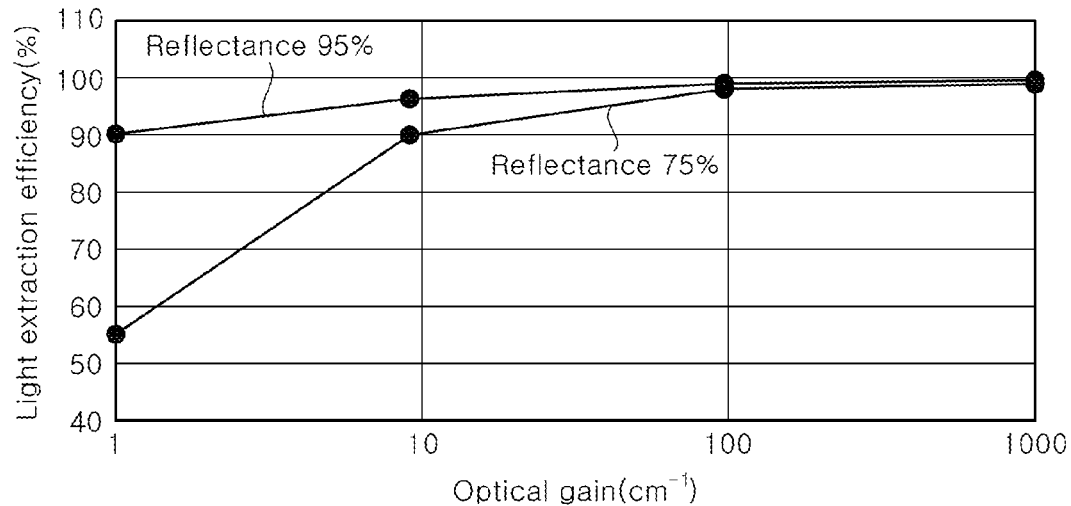
FIG. 5 is a graph depicting light extraction efficiency depending upon optical gain.

On the other hand, light extraction efficiency depending upon optical gain of a GaN-based semiconductor was calculated and is shown in FIG. 5. A light emitting diode used for this calculation had the same structure as the light emitting diode used for calculation of the light extraction efficiency depending upon the coefficient of absorption. The light extraction efficiency depending upon optical gain was also calculated for two cases of the reflective electrode 43 having a reflectance of 95% and a reflectance of 75%. As can be seen from FIG. 5, even when the reflective electrode 43 had a low reflectance of 75%, the light extraction efficiency increased with increasing optical gain and approached 100% at an optical gain of about 100 $cm^{-1}$. Accordingly, it can be seen that high light extraction efficiency can be realized at an optical gain of about 100 $cm^{-1}$.

Figure 6:
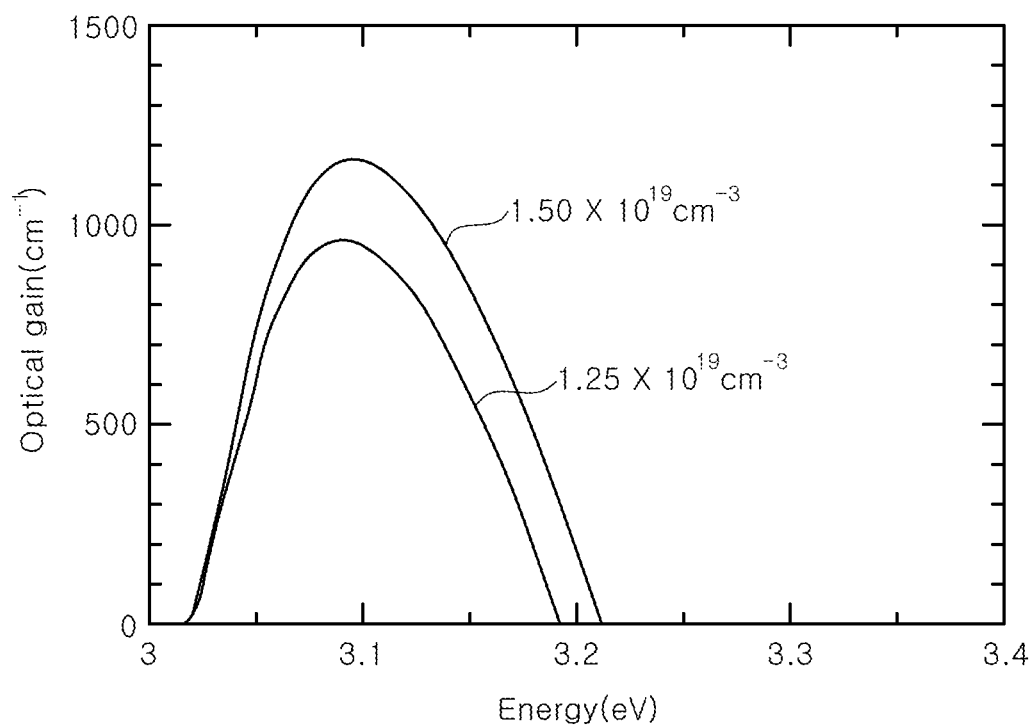
FIG. 6 is a graph depicting optical gain spectrum.

Next, in order to calculate the amount of carriers in an InGaN well layer in a multi-quantum well structure comprising InGaN well layers and GaN barrier layers for the GaN-based semiconductor to have an optical gain of 100 $cm^{-1}$ or more, the band gap energy was calculated using the Luttinger Hamiltonian and optical gain was calculated based on the band gap energy. The InGaN well layer had a thickness of 3 nm. FIG. 6 is a graph depicting optical gain spectrum depending upon band gap energy. FIG. 6 also shows dependency of the optical gain upon the carrier concentration in the InGaN well layer. Optical gain increases with increasing carrier concentration. Further, it could be seen that the optical gain had a peak value of about 1,000 $cm^{-1}$ at a carrier concentration of $1.25 \times 10^{19}$ $cm^{-3}$. This value is enough to increase the light extraction efficiency to near 100%.

On the other hand, crystal defects generally cause generation of carriers through absorption of photons at the energy level of the defects. The generated carriers are recombined at the Shockley-Read-Hall recombination rate without generation of light and the energy of the photons is lost as heat. Since such photon absorption relates to a deep level, lifespan of the corresponding carriers is longer than transition between bands. Thus, when the carriers are trapped due to absorption of photons by the crystal defects, absorption of the photons by the same crystal defects does not occur for the lifespan of the carriers. That is, even when defects are present in a crystal, the absorption amount of light decreases with increasing concentration of carriers trapped in the crystal. In this embodiment, since the light emitting diode generates simulated emission by trapping light reflected through total internal reflection and maintains a high carrier concentration to cause population inversion of carriers, the light emitting diode allows saturation of the traps of the crystal defects, thereby preventing extinction of carriers through trapping of the carriers by defects.

Furthermore, when absorption loss occurs in a semiconductor layer, the semiconductor layer has a complex refractive index. As a result, a light wave can be propagated to air without total internal reflection. That is, complete total internal reflection does not occur at the interface between air and the semiconductor layer allowing absorption loss, and some fractions of light emitted from the active layer 25 are discharged to the air regardless of the incidence angle, thereby improving light extraction efficiency.

Figure 7:
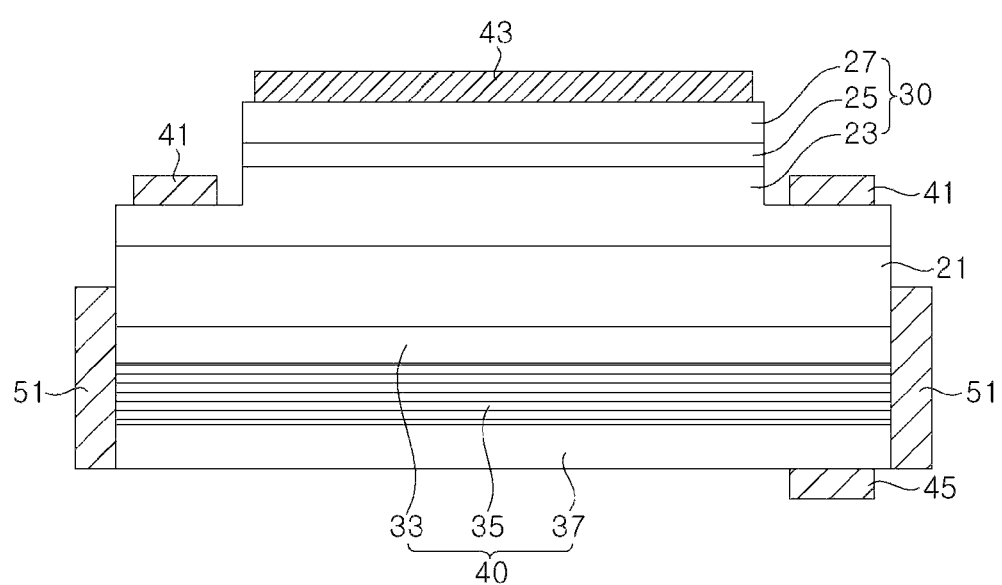
FIG. 7 is a schematic sectional view of a light emitting diode according to another embodiment of the present disclosure.

Referring to FIG. 7, the light emitting diode according to this embodiment is generally similar to the light emitting diode described with reference to FIG. 1 and further includes an additional electrode 45 electrically connected to the optical trap 40. Further, the light guide layer 37 according to the above embodiment shown in FIG. 1 is the first conductivity type, whereas the light guide layer 37 according to this embodiment is the second conductivity type.

The first electrode 41 may be used as a cathode and the additional electrode 45 may be used as an anode, whereby carriers can be injected into the light absorption layer 35 through an external power source.

According to this embodiment, the carriers can be pumped using an external power source, thereby easily causing population inversion of the carriers.

EXPERIMENTAL EXAMPLES

Figure 8A:
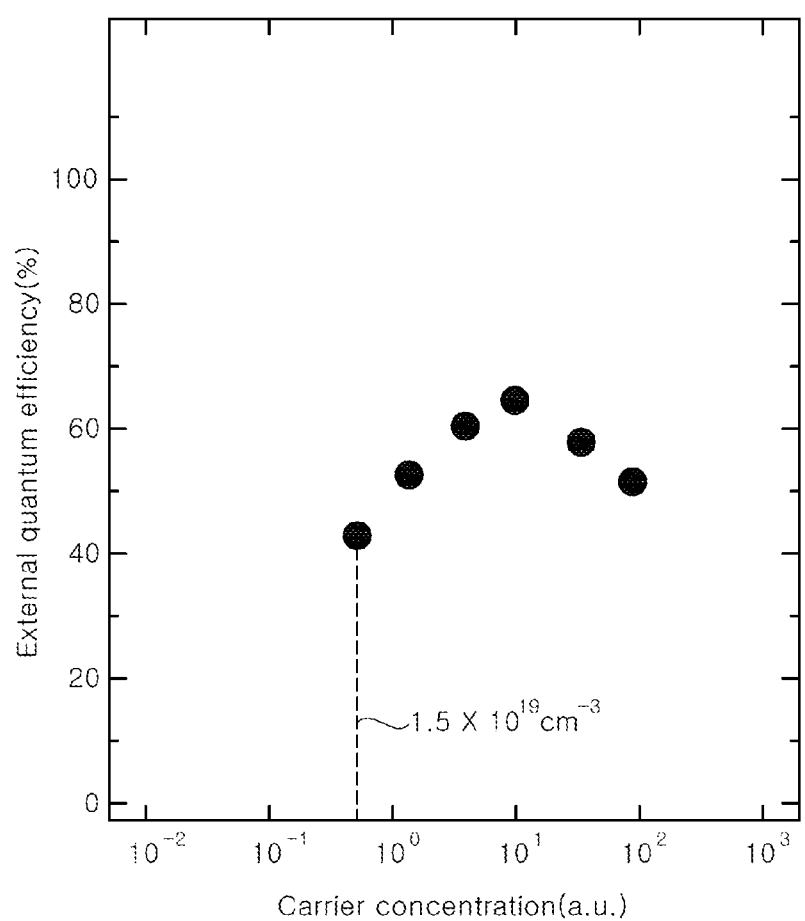
FIG. 8A is a graph depicting external quantum efficiency depending upon carrier concentration in the related art.

To assess improvement in light extraction efficiency according to the present disclosure, an actual light emitting diode was manufactured. FIGS. 8A and 8B provide the known external quantum efficiency depending upon carrier concentration at room temperature.

FIG. 8A shows external quantum efficiency of a typical flip-chip light emitting diode (comparative example), which does not include the optical trap 40 and is manufactured using a relatively thick substrate 21, and FIG. 8B shows external quantum efficiency of a flip-chip light emitting diode in accordance with the present disclosure (inventive example), in which the optical trap 40 is disposed under the substrate 21.

In the comparative example, the total thickness of the GaN-based semiconductor, that is, the total thickness of the substrate and the semiconductor layer, was set to about 100 µm. In the inventive example, the total thickness of the GaN-based semiconductor, that is, the total thickness of the optical trap 40, the substrate 21 and the light emitting structure 30, was also set to about 100 µm, and the optical trap 40 disposed under the substrate 21 was formed to a thickness of about 11.4 µm. Further, the optical trap 40 includes n-type AlGaN light guide layers 33, 37 each having a thickness of 5 µm and a light absorption layer 35 interposed between the n-type AlGaN light guide layers 33, 37, in which the light absorption layer 35 was formed as a super-lattice layer by alternately stacking 200 pairs of InGaN well layers each having a thickness of 3.5 nm and InGaN barrier layers each having a thickness of 3.5 nm. Furthermore, to improve reflectance at both sides of the optical trap 40, a side reflector 51 consisting of two layers of $SiO_2$ and Ag was formed.

Referring to FIG. 8A, in the comparative example, when the reflective electrode 43 had an ideal reflectance of 95% and the substrate 21 had a coefficient of light absorption of 0, the light emitting diode had a light extraction efficiency of about 80%, which is the theoretical limit, as shown in FIG. 4. Accordingly, when internal quantum efficiency is 100%, the limit of the external quantum efficiency becomes 80%. However, as mentioned above, since light absorption occurs in a 100 µm thick GaN-based semiconductor, the coefficient of light absorption is not 0 and the reflectance of the reflective electrode 43 cannot reach 95% in practice. Thus, the internal quantum efficiency cannot reach 100%. For this reason, the light emitting diode of the comparative example merely exhibited a maximum external quantum efficiency of 64% at room temperature.

Referring to FIG. 8B, the light emitting diode of the inventive example exhibited a maximum external quantum efficiency of about 90%. External quantum efficiency much greater than 80% supports the effects of the present disclosure. In addition, the light emitting diode of the inventive example exhibited higher external quantum efficiency than the light emitting diode of the comparative example at a relatively low carrier concentration and at room temperature. Optical density was calculated based on the carrier injection concentration and internal quantum efficiency of the light emitting diode, and assuming that light was absorbed into the optical trap 40, an actual carrier concentration providing a maximum external quantum efficiency of about 90% was about $1.5 \times 10^{19}$ cm$^{-3}$. This value was substantially coincident with the optical gain having a peak value of about 1,000 cm$^{-1}$, and from this result, it could be seen that improvement in light extraction efficiency was obtained by the light emitting diode of the present disclosure.

In the experimental example, the thickness of the optical trap 40 of the light emitting diode of the inventive example was set to 11.4 µm, which is smaller than the thickness of the substrate 21. Alternatively, the thickness of the optical trap 40 may be set to a greater thickness than the substrate 21. For example, the thickness of the substrate 21 may be set to about 20 µm and the thickness of the optical trap 40 may be set to about 80 µm.

Figure 9:
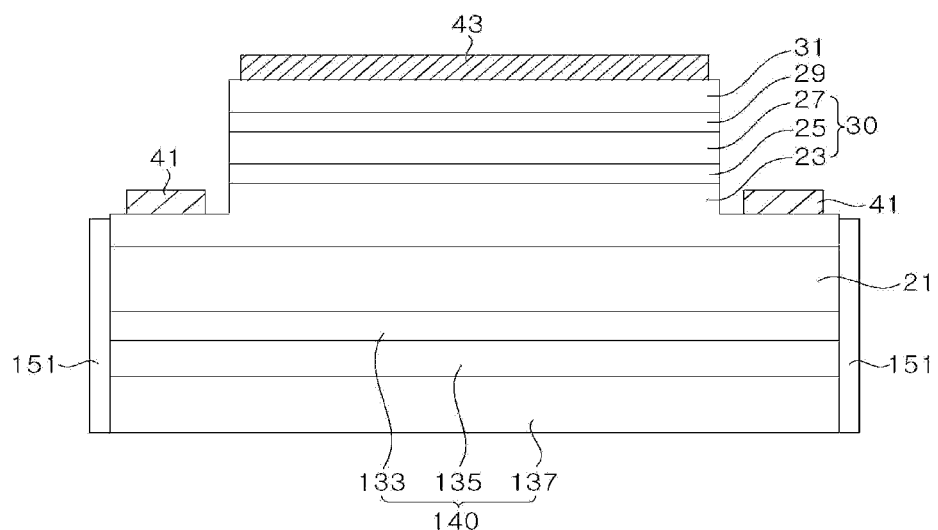
FIG. 9 is a schematic sectional view of a light emitting diode according to a further embodiment of the present disclosure.
Figure 10:
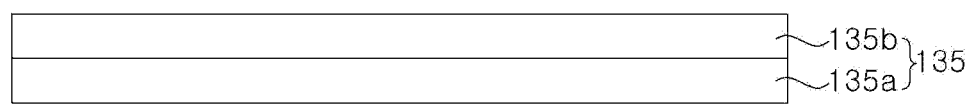
FIG. 10 is an enlarged cross-sectional view of a light absorption layer shown in FIG. 9.
Figure 11:
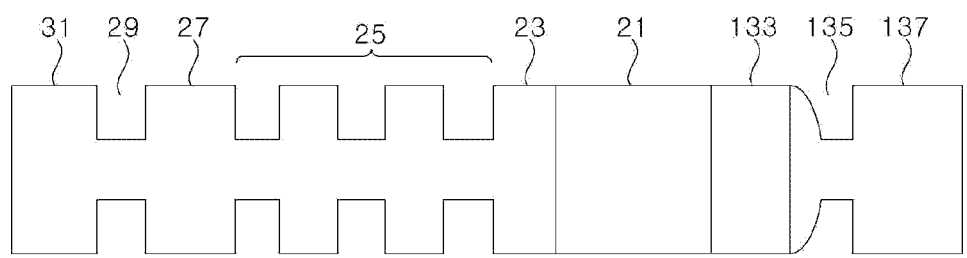
FIG. 11 is a schematic energy band diagram illustrating the light emitting diode shown in FIG. 9.

FIG. 9 is a schematic sectional view of a light emitting diode according to a further embodiment of the present disclosure, FIG. 10 is an enlarged cross-sectional view of a light absorption layer shown in FIG. 9, and FIG. 11 is a schematic energy band diagram illustrating the light emitting diode shown in FIG. 9.

Referring to FIGS. 9, 10 and 11, the light emitting diode according to this embodiment is generally similar to the light emitting diode described with reference to FIG. 1 and the following description will focus on different features of this embodiment.

First, an optical trap 140 includes a light absorption layer 135 interposed between a first n-type semiconductor layer 133 and a second n-type semiconductor layer 137. The light absorption layer 135 may include a constant composition layer 135a having the same band gap as the well layers of the active layer 25. The constant composition layer 135a may be a semiconductor layer having the same composition as the well layers. For example, when the well layers are formed of InGaN, the constant composition layer 135a may also be formed of InGaN. However, it should be understood that the present disclosure is not limited thereto. Alternatively, the constant composition layer 135a may be a semiconductor layer formed of a different composition having the same band gap as or a similar band gap to the well layers.

The first n-type semiconductor layer 133 and the second n-type semiconductor layer 137 may be formed of a semiconductor, for example, GaN, which has a broader band gap than the constant composition layer 135a.

The light absorption layer 135 may further include a gradient composition layer 135b disposed on the constant composition layer 135a. The gradient composition layer 135b may be formed to have an energy barrier gradually increasing from the constant composition layer 135a towards the active layer 25 so as to assist in shifting of free carriers, for example, free electrons, generated in the light absorption layer 135 to the active layer 25, as shown in FIG. 11. The energy carrier may increase in a step shape.

By adopting the gradient composition layer 135b, free electrons generated by light trapped by the constant composition layer 135a can be easily shifted towards the active layer 25, thereby further improving luminous efficacy.

The constant composition layer 135a and the gradient composition layer 135b may be formed of an n-type semiconductor doped with n-type dopants or an undoped semiconductor.

In consideration of a diffusion distance of free electrons generated in the light absorption layer 135, the distance between the light absorption layer 135 and the active layer 25 may be adjusted. For example, the light absorption layer 135 may be separated a distance of about 400 nm or less, specifically 300 nm or less, more specifically 200 nm or less, from the active layer 25.

By decreasing the distance between the light absorption layer 135 and the active layer 25, the free electrons may be easily shifted from the light absorption layer 135 to the active layer 25 and may be reused to generate light.

The light emitting diode according to this embodiment may further include a light absorption layer 29 formed on the second conductivity type semiconductor layer 27. The light absorption layer 29 may be formed of a p-type semiconductor doped with p-type dopants or an undoped semiconductor. The light absorption layer 29 may be formed of a semiconductor, for example, InGaN, which has the same band gap as the well layers. The light absorption layer 29 may be formed to a thickness of, for example, about 10 nm.

Furthermore, in consideration of a diffusion distance of free carriers, for example, free holes, generated in the light absorption layer 29, the distance between the light absorption layer 29 and the active layer 25 may be adjusted. For example, the light absorption layer 29 may be separated a distance of about 100 nm or less, specifically 50 nm or less, from the active layer 25.

According to this embodiment, a side surface of the optical trap 140 may be covered by a dielectric layer 151. Although the light emitting diode according to this embodiment may include a side reflector formed of a reflective metal as in the above embodiment, the light emitting diode can increase the optical density of the optical trap 140 and thus does not require very high reflectance at the side of the optical trap 140. Accordingly, the dielectric layer 151 may be formed of a resin, $SiO_2$, $Si_3N_4$, $TiO_2$, or the like to cover the side surface of the optical trap 140 or may be omitted. Even in this structure, the optical density can be improved through reflection of light due to difference in index of refraction between the semiconductor layer and air.

According to this embodiment, the optical trap 140 generates free electrons by trapping some fractions of light generated from the active layer 25 and not discharged outside due to total internal reflection. The generated free electrons are shifted towards the active layer 25 by a drift electric field generated by forward bias and contribute to luminous recombination in the active layer 25, thereby improving luminous efficacy.

Further, the optical trap 140 generates free holes by trapping some fractions of light generated from the active layer 25 and not discharged outside due to total internal reflection. The generated free electrons are shifted towards the active layer 25 by a drift electric field generated by forward bias and contribute to luminous recombination in the active layer 25, thereby improving luminous efficacy.

Figure 12A:
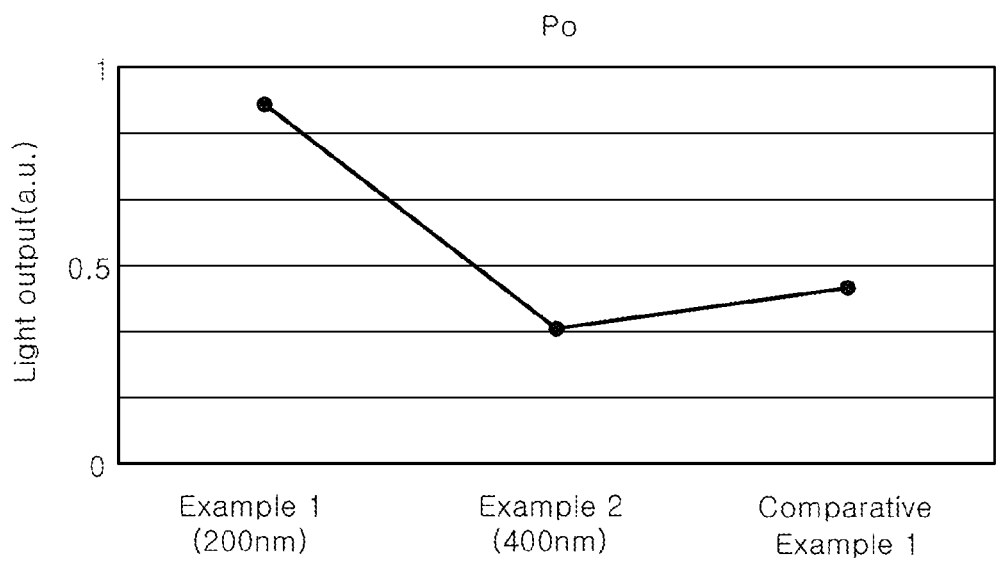
FIG. 12A is a graph depicting light output depending upon distances of an n-type light absorption layer and an active layer.
Figure 12B:
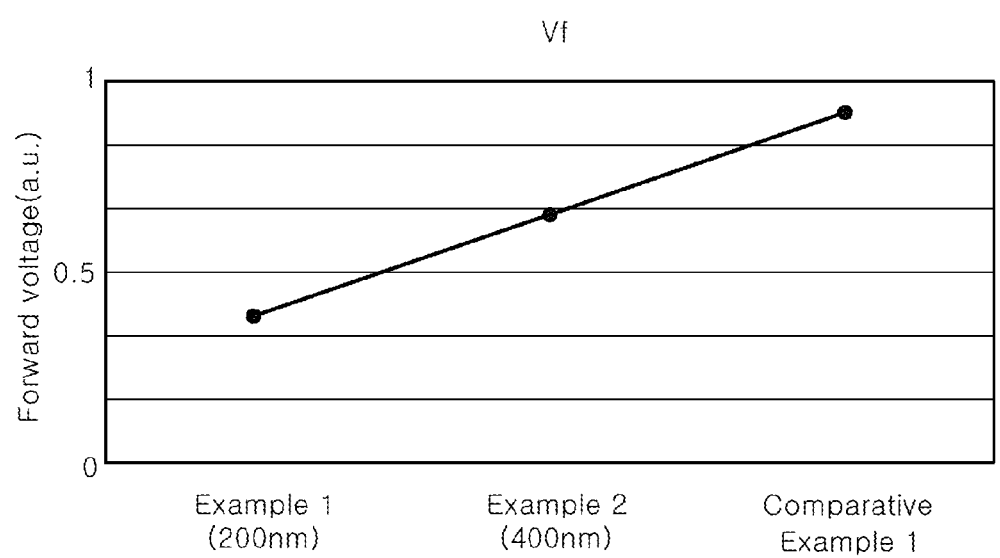
FIG. 12B is a graph depicting forward voltage depending upon distances of an n-type light absorption layer and an active layer.

FIGS. 12A and 12B are graphs depicting light output and forward voltage depending upon distances of the n-type light absorption layer and the active layer.

In Example 1 and Example 2, GaN-based light emitting diodes were manufactured to have a separation distance of about 200 nm and a separation distance of about 400 nm between the light absorption layer 135 and the active layer 25, respectively, and for a Comparative Example 1, a typical GaN-based light emitting diode not including a light absorption layer was manufactured. For multiple samples of Example 1, Example 2 and the Comparative Example 1, light output and forward voltage thereof were measured at an electric current of 175 mA and average values thereof are depicted in the graphs.

Referring to FIG. 12A, the light emitting diode of Example 1 had the highest light output and the light emitting diode of Example 2 had a slightly smaller light output than the light emitting diode of the Comparative Example 1. Referring to FIG. 12B, the light emitting diode of Example 1 had the lowest forward voltage and the light emitting diode of the Example 2 had a lower forward voltage than the light emitting diode of the Comparative Example 1.

Referring to FIGS. 12A and 12B, with the light absorption layer 135, the light emitting diode of the present disclosure provided an effect of reducing forward voltage and could improve light output, particularly, through adjustment of the separation distance between the light absorption layer 135 and the active layer 25.

Figure 13:
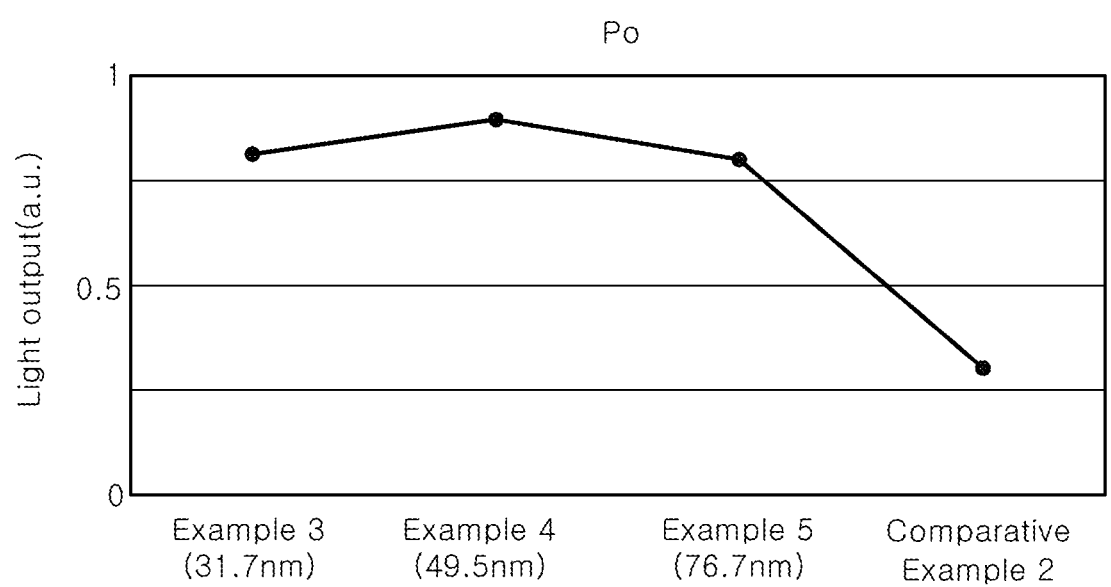
FIG. 13 is a graph depicting light output depending upon distances of a p-type light absorption layer and an active layer.

FIG. 13 is a graph depicting light output depending upon distances of the p-type light absorption layer 29 and the active layer 25. Here, in light emitting diodes of Examples 3 to 5, the light absorption layer 29 was formed to a thickness of 10 nm and a light emitting diode of a Comparative Example 2 did not include the light absorption layer 29.

All of the light emitting diodes of Examples 3 to 5 each adopting the light absorption layer 29 exhibited higher light output than the light emitting diode of the Comparative Example 2 not including the light absorption layer 29.

Figure 14A:
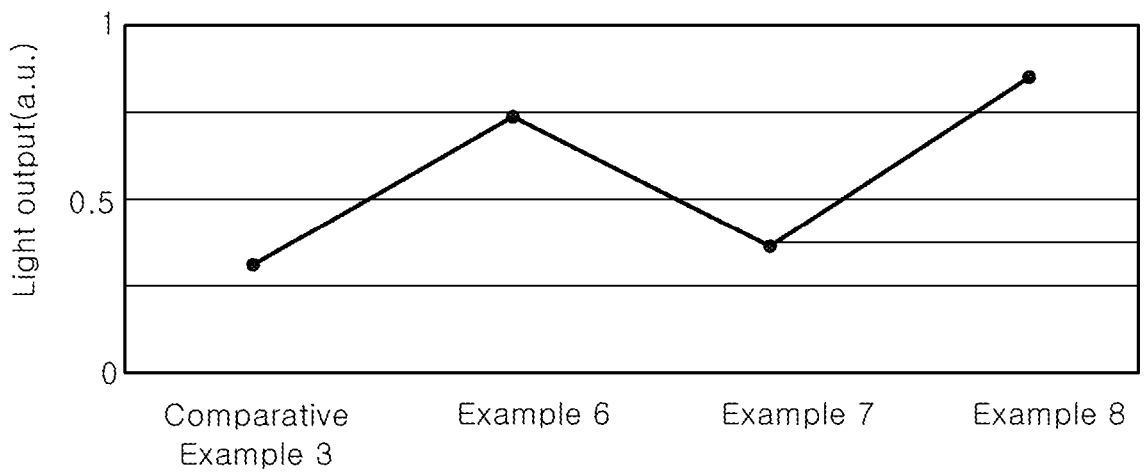
FIG. 14A is a graph depicting light output depending upon the structure and thickness of the light absorption layer.
Figure 14B:
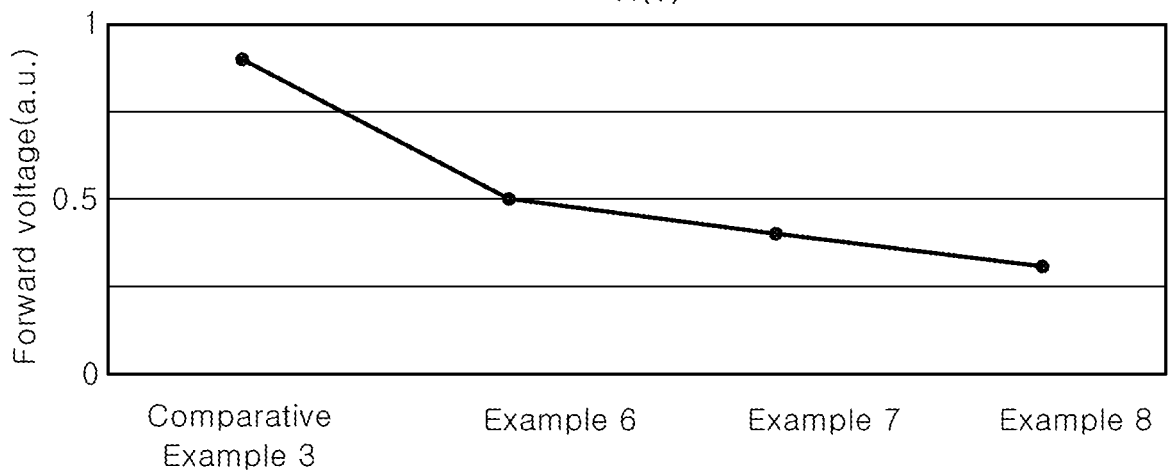
FIG. 14B is a graph depicting forward voltage depending upon the structure and thickness of the light absorption layer.

FIGS. 14A and 14B are graphs depicting light output and forward voltage depending upon the structure and thickness of the light absorption layer.

A light emitting diode of a Comparative Example 3 corresponds to a typical GaN-based light emitting diode not adopting a light absorption layer and a light emitting diode of Example 6 corresponds to a GaN-based light emitting diode including a light absorption layer, which includes a constant composition layer formed of the same composition as the active layer 25 and having a thickness of 15 nm without a gradient composition layer. A light emitting diode of Example 7 corresponds to a GaN-based light emitting diode including a light absorption layer 135 having a total thickness of 15 nm, which includes a constant composition layer 135a and a gradient composition layer 135b, each having the same thickness of about 7.5 nm, and a light emitting diode of Example 8 corresponds to a GaN-based light emitting diode including a light absorption layer 135 having a total thickness of 40 nm, which includes a constant composition layer 135a and a gradient composition layer 135b, each having the same thickness of about 15 nm.

Referring to FIG. 14A, all of the light emitting diodes of Examples 6 to 8 each including the light absorption layer 135 exhibited higher light output than the light emitting diode of the Comparative Example 3. In particular, the light emitting diode of Example 8 adopting the constant composition layer 135a and the gradient composition layer 135b formed to a total thickness of 30 nm exhibited the highest light output.

In Example 6 in which the constant composition layer 135a was formed to a thickness of 15 nm and the gradient composition layer 135b was not formed, the light emitting diode exhibited higher light output than the light emitting diode of Example 7, in which the constant composition layer 135a was formed to a thickness of about 7.5 nm and the gradient composition layer 135b was formed to a thickness of about 7.5 nm. Accordingly, the thickness of the constant composition layer 135a has a greater effect on light output than the gradient composition layer 135b.

Referring to FIG. 14B, all of the light emitting diodes of Examples 6 to 8 exhibited lower forward voltage than the light emitting diode of the Comparative Example 3. From among Examples 6 to 8, the forward voltage was further decreased in the structure including the gradient composition layer 135b and in the structure including the light absorption layer 135 having a greater thickness.

Luminous recombination lifespan was measured by time-resolved photoluminescence and an n-value corresponding to an ideality factor in a p-n junction was measured under conditions of infinitesimal current/voltage characteristics. The light emitting diodes of Examples 7 and 8 had shorter luminous recombination lifespan than the light emitting diode of Example 6. In particular, the light emitting diode of Example 8 had a smaller n-value than the light emitting diodes of Examples 6 and 7. That is, it could be seen that the light emitting diode of Example 8, in which the light absorption layer was formed to a great thickness, exhibited the shortest luminous recombination lifespan to improve luminous efficacy and had a small n-value, thereby realizing ideal p-n junction carrier transportation.

Figure 15A:
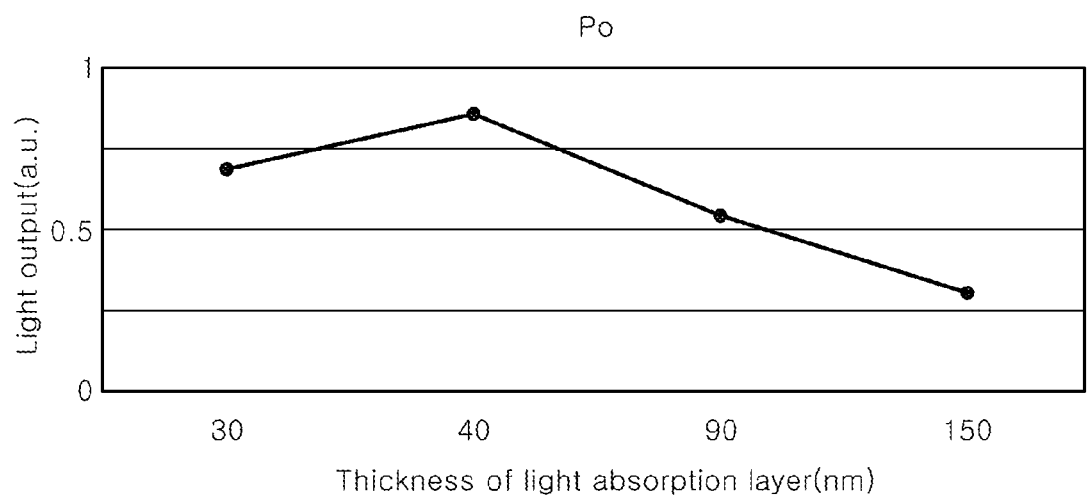
FIG. 15A is a graph depicting light output depending upon the thickness of the light absorption layer.
Figure 15B:
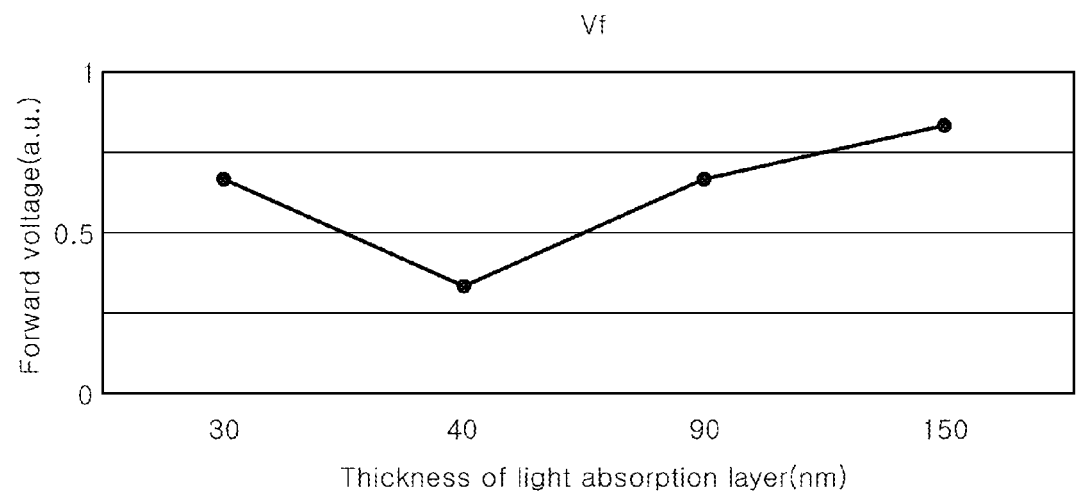
FIG. 15B is a graph depicting forward voltage depending upon the thickness of the light absorption layer.

FIGS. 15A and 15B are graphs depicting light output and forward voltage depending upon the thickness of the light absorption layer.

In samples each having a light absorption layer, the light absorption layers had a thickness of about 30 nm, a thickness of about 40 nm, a thickness of about 90 nm, and a thickness of about 150 nm, respectively, and the constant composition layer and the gradient composition layer were formed to the same thickness.

As illustrated in FIGS. 15A and 15B, with the light absorption layer having a thickness of 40 nm, the light emitting diode exhibited the highest light output and the lowest forward voltage. As the thickness of the light absorption layer increased above 40 nm, the light output decreases and the forward voltage increased.

Although some exemplary embodiments have been described herein, it should be understood by those skilled in the art that the present disclosure is not limited thereto. It should be understood that features or components of one embodiment can also be applied to other embodiments without departing from the spirit and scope of the present disclosure.

What is claimed is:

1. A light emitting diode comprising:
   a light generation portion comprising an active layer interposed between a first conductivity type semiconductor layer and a second conductivity type semiconductor layer, wherein the active layer generates light;
   an optical trap disposed on an optical path of light generated from the active layer and comprising a light absorption layer interposed between light guide layers;
   a side reflector disposed on a side surface of the optical trap;
   an electrode disposed on the second conductivity type semiconductor layer and electrically connected to the second conductivity type semiconductor layer, wherein the optical trap is disposed under the first conductivity type semiconductor layer to face the electrode with the light generation portion disposed there between; and
   a semiconductor substrate interposed between the light generation portion and the optical trap.

2. The light emitting diode according to claim 1, wherein the light absorption layer has a multi-quantum well structure comprising multiple barrier layers and multiple well layers.

3. The light emitting diode according to claim 2, wherein the multiple well layers of the light absorption layer have an energy band gap narrower than or equal to energy of the light generated from the active layer.

4. The light emitting diode according to claim 3, wherein the active layer has a multi-quantum well structure comprising multiple barrier layers and multiple well layers, and the well layers of the light absorption layer have an energy band gap narrower than or equal to an energy band gap of the well layers of the active layer.

5. The light emitting diode according to claim 1, wherein the electrode is a reflective electrode.

6. The light emitting diode according to claim 1, wherein the side reflector covers at least part of the semiconductor substrate.

7. The light emitting diode according to claim 1, wherein the semiconductor substrate is a GaN-based substrate.

8. The light emitting diode according to claim 7, wherein the semiconductor substrate has a thickness of 10 µm to 100 µm.

9. The light emitting diode according to claim 1, wherein the light guide layers are of the same conductivity type as the first conductivity type semiconductor layer.

10. The light emitting diode according to claim 1, further comprising a first electrode electrically connected to the first conductivity type semiconductor layer.

11. The light emitting diode according to claim 10 further comprising a second electrode electrically connected to the optical trap.

12. The light emitting diode according to claim 11, wherein a light guide layer adjacent to the second electrode is of a second conductivity type.

13. A light emitting diode comprising:
   a first conductivity type semiconductor layer;
   an active layer disposed on the first conductivity type semiconductor layer;
   a second conductivity type semiconductor layer disposed on the active layer;
   a reflective electrode disposed on the second conductivity type semiconductor layer;
   a first light guide layer disposed under the first conductivity type semiconductor layer;
   a semiconductor substrate interposed between the first conductivity type semiconductor layer and the first light guide layer, wherein the semiconductor substrate is of the same conductivity type as the first conductivity type semiconductor layer;
   a light absorption layer disposed under the first light guide layer;
   a second light guide layer disposed under the light absorption layer; and a side reflector disposed on a side surface of the light absorption layer, wherein the light absorption layer comprises a semiconductor layer having an energy band gap narrower than or equal to energy of light generated from the active layer.

14. The light emitting diode according to claim 13, wherein the side reflector covers at least part of the semiconductor substrate.

15. The light emitting diode according to claim 13, wherein the light emitting diode emits light through the second light guide layer.

16. The light emitting diode according to claim 13 further comprising: a first electrode electrically connected to the first conductivity type semiconductor layer; and a second electrode electrically connected to the second light guide layer.

17. A light emitting diode comprising:
- a light generation portion comprising an active layer interposed between a first conductivity type semiconductor layer and a second conductivity type semiconductor layer, wherein the active layer generates light;
- a first electrode electrically connected to the first conductivity type semiconductor layer;
- an optical trap disposed on an optical path of light generated from the active layer and comprising a light absorption layer interposed between light guide layers;
- a semiconductor substrate interposed between the light generation portion and the optical trap;
- a side reflector disposed on a side surface of the optical trap; and
- a reflective electrode disposed on the second conductivity type semiconductor layer and electrically connected to the second conductivity type semiconductor layer, wherein the optical trap is disposed under the first conductivity type semiconductor layer to face the reflective electrode with the light generation portion disposed therebetween.

18. The light emitting diode according to claim 17, further comprising a third electrode electrically connected to the optical trap.

19. The light emitting diode according to claim 17, wherein the semiconductor substrate is of the same conductivity type as one of the first conductivity type semiconductor layer or the second conductivity type semiconductor layer.

20. The light emitting diode according to claim 17, wherein the side reflector covers at least part of the semiconductor substrate.

* * * * *